United States Patent
Dubost et al.

(10) Patent No.: US 8,207,764 B2
(45) Date of Patent: Jun. 26, 2012

(54) ENHANCEMENT OF POWER MANAGEMENT USING DYNAMIC VOLTAGE AND FREQUENCY SCALING AND DIGITAL PHASE LOCK LOOP HIGH SPEED BYPASS MODE

(75) Inventors: Gilles Dubost, Valbonne (FR); Franck Dahan, Nice (FR); Hugh Thomas Mair, Fairview, TX (US); Sylvain Dubois, Antibes (FR)

(73) Assignee: Texas Instruments Incorporated, Dallas, TX (US)

( * ) Notice: Subject to any disclaimer, the term of this patent is extended or adjusted under 35 U.S.C. 154(b) by 330 days.

(21) Appl. No.: 12/607,981

(22) Filed: Oct. 28, 2009

(65) Prior Publication Data

US 2011/0095794 A1    Apr. 28, 2011

(51) Int. Cl.
*H03L 7/06*      (2006.01)
(52) U.S. Cl. ......... 327/149; 327/153; 327/158; 327/161
(58) Field of Classification Search .................. 327/149, 327/153, 158, 161
See application file for complete search history.

(56) References Cited

U.S. PATENT DOCUMENTS

| | | | | |
|---|---|---|---|---|
| 4,922,141 A | * | 5/1990 | Lofgren et al. | 327/158 |
| 5,719,514 A | * | 2/1998 | Sato | 327/262 |
| 7,026,850 B2 | * | 4/2006 | Atyunin et al. | 327/158 |
| 2010/0117697 A1 | * | 5/2010 | Kanno et al. | 327/158 |

* cited by examiner

*Primary Examiner* — Patrick O'Neill
(74) *Attorney, Agent, or Firm* — Ronald O. Neerings; Wade James Brady, III; Frederick J. Telecky, Jr.

(57) ABSTRACT

An apparatus for clock/voltage scaling includes a device power manager arranged to supply a scalable frequency clock to an interface; a delay-locked loop, supplied by a constant fixed frequency clock and a constant voltage, arranged to generate a unique code depending on process, voltage, and/or temperature; and controlled delay line elements coupled to the delay-locked loop, arranged to generate an appropriate delayed data strobe based on the unique code. A method for a digital phase lock loop high speed bypass mode includes providing a first digital phase lock loop in a first high speed clock domain; providing a second digital phase lock loop in a second clock domain; controlling an output of a first glitch-less multiplexer according to preselected settings using a device power manager synchronized locally; and controlling an output of a second glitchless multiplexer using a control logic element of the second digital phase lock loop.

15 Claims, 4 Drawing Sheets

ENHANCEMENT OF POWER MANAGEMENT USING DYNAMIC VOLTAGE AND FREQUENCY SCALING AND DIGITAL PHASE LOCK LOOP HIGH SPEED BYPASS MODE

TECHNICAL FIELD OF THE PRESENT DISCLOSURE

The present disclosure relates generally to information handling devices and systems. More particularly, the present disclosure describes an apparatus, method, and system useful for enhancement of locked loop operations including clock and voltage scaling on an interface, such as an interface that uses a double data rate or a multiple data rate, for example a chip-to-chip interface that allows connecting the interconnects of two different systems on chips, and/or for providing a digital phase lock loop high speed bypass mode.

BACKGROUND OF THE PRESENT DISCLOSURE

In order to reduce dynamic and static power consumption on leaky processes, devices implement dynamic voltage and frequency scaling to adapt energy to the required performance. Voltage and frequency changes impact system behavior and should be properly managed. For example, voltage and frequency changes impact delay-locked loops (DLLs) used in interfaces such as memory controllers by causing loss of lock of the delay-locked loops (DLLs) so that on-going accesses to devices such as memory may be corrupted. For conventional devices to continue to process properly during frequency transitions requires heavy and undesirable software management, for example. Performing dynamical voltage and frequency scaling (DVFS) conventionally on an interface such as a memory controller causes the delay-locked loop (DLL) or any equivalent delay control cell, used, for example, to manage an external double data rate (DDR) memory, to lose its lock and, therefore, corrupt memory accesses. Conventionally, dynamic voltage and frequency scaling (DVFS) is only applied on processors.

In order to optimize multi-processor devices and uni-processor, multi-core processor devices, a multiple asynchronous clock domain architecture is implemented. Each of the multiple asynchronous clock domains may potentially be supplied by a dedicated digital phase-locked loop (DPLL) to match the various frequency requirements. However, each of the digital phase-locked loops (DPLLs) in each of the asynchronous clock domains generates a high speed synthesized clock and has a significant dynamic power consumption. Furthermore, when a new synthesized frequency value is programmed on a given digital phase-locked loop (DPLL), for example, in a dynamic voltage and frequency scaling (DVFS) context, processing performance is negatively impacted during the digital phase-locked loop (DPLL) re-lock operation.

SUMMARY OF THE PRESENT DISCLOSURE

According to various illustrative embodiments, an apparatus, method, and system for enhancement of locked loop operations including clock and voltage scaling on an interface and/or for providing a digital phase lock loop high speed bypass mode are described. In one aspect, the apparatus comprises a device power manager coupled to the interface and arranged to supply a scalable frequency clock to the interface. The apparatus also comprises a delay-locked loop supplied by a substantially constant fixed frequency clock from the device manager and a substantially constant voltage from an embedded low dropout regulator, the delay-locked loop arranged to generate a unique code depending on at least one of process, voltage, and temperature. The apparatus also comprises a plurality of controlled delay line elements coupled to the delay-locked loop and arranged to use the unique code to build a delay and generate an appropriate delayed data strobe, the delay being adjusted by having up to N controlled delay line elements chained together, N being a ratio between the substantially constant fixed frequency and the scalable frequency.

In another aspect, a method for a digital phase lock loop high speed bypass mode comprises providing a first digital phase lock loop in a first clock domain having a high speed clock. The method also comprises providing at least one second digital phase lock loop in a second clock domain, the at least one second digital phase lock loop having a first glitchless multiplexer having the high speed clock as one input and a low speed system reference clock as another input and a second glitchless multiplexer having a first output of the first glitchless multiplexer as a first input and a synthesized clock from a core of the at least one second digital phase lock loop as a second input. The method also comprises controlling the first output of the first glitchless multiplexer according to preselected settings using a device power manager synchronized locally to ensure proper switching. The method also comprises controlling a second output of the second glitchless multiplexer using a control logic element of the at least one second digital phase lock loop, the second output of the second glitchless multiplexer comprising the synthesized clock when the at least one second digital phase lock loop is in a lock mode and comprising the first output of the first glitchless multiplexer when the at least one second digital phase lock loop is in the digital phase lock loop high speed bypass mode.

In yet another aspect, a system for clock and voltage scaling on an interface and for providing a digital phase lock loop high speed bypass mode is provided, the system comprising a device power manager coupled to the interface and arranged to supply a scalable frequency clock to the interface. The system also comprises a delay-locked loop supplied by a substantially constant fixed frequency clock from the device manager and a substantially constant voltage from an embedded low dropout regulator, the delay-locked loop arranged to generate a unique code depending on at least one of process, voltage, and temperature. The system also comprises a plurality of controlled delay line elements coupled to the delay-locked loop and arranged to use the unique code to build a delay and generate an appropriate delayed data strobe, the delay being adjusted by having up to N controlled delay line elements chained together, N being a ratio between the substantially constant fixed frequency and the scalable frequency. The system also comprises a first digital phase lock loop in a first clock domain having a high speed clock. The system also comprises at least one second digital phase lock loop in a second clock domain, the at least one second digital phase lock loop having a first glitchless multiplexer having the high speed clock as one input and a low speed system reference clock as another input and a second glitchless multiplexer having a first output of the first glitchless multiplexer as a first input and a synthesized clock from a core of the at least one second digital phase lock loop as a second input, wherein the device power manager is arranged to control the first output of the first glitchless multiplexer according to preselected settings and synchronized locally to ensure proper switching. The system also comprises a control logic element of the at least one second digital phase lock loop arranged to control a second output of the second glitchless multiplexer, the second output of the second glitchless multiplexer comprising the synthesized clock when the at least one second digital phase lock loop is in a lock mode and comprising the first output of the first glitchless multiplexer when the at least one second digital phase lock loop is in the digital phase lock loop high speed bypass mode.

BRIEF DESCRIPTION OF THE DRAWINGS

The following figures form part of the present specification and are included to further demonstrate certain aspects of the present claimed subject matter, and should not be used to limit or define the present claimed subject matter. The present claimed subject matter may be better understood by reference to one or more of these drawings in combination with the description of embodiments presented herein. Consequently, a more complete understanding of the present embodiments and further features and advantages thereof may be acquired by referring to the following description taken in conjunction with the accompanying drawings, in which the leftmost significant digit(s) in the reference numerals denote(s) the first figure in which the respective reference numerals appear, wherein:

It is to be noted, however, that the appended drawings illustrate only typical embodiments of the present claimed subject matter and are, therefore, not to be considered limiting of the scope of the present claimed subject matter, as the present claimed subject matter may admit to other equally effective embodiments.

NOTATION AND NOMENCLATURE

Certain terms are used throughout the following description and claims to refer to particular system components and configurations. As one skilled in the art having the benefit of the present disclosure will appreciate, companies may refer to a component by different names. This document does not intend to distinguish between components that differ in name but not function. In the following discussion and in the claims, the terms "including" and "comprising" are used in an open-ended fashion, and, thus, should be interpreted to mean "including, but not limited to . . . ," and so forth. Also, the term "couple" or "couples" is intended to mean either an indirect or direct electrical connection. Thus, if a first device couples to a second device, that connection may be through a direct electrical connection or though an indirect electrical connection via other devices and/or connections. Furthermore, the term "information" is intended to refer to any data, instructions, or control sequences that may be communicated between components of a device. For example, if information is sent between two components, data, instructions, control sequences, or any combination thereof may be sent between the two components.

DETAILED DESCRIPTION OF ILLUSTRATIVE EMBODIMENTS

Illustrative embodiments of the present claimed subject matter are described in detail below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort would be a routine undertaking for those of ordinary skill in the art having the benefit of the present disclosure.

Figure 1:
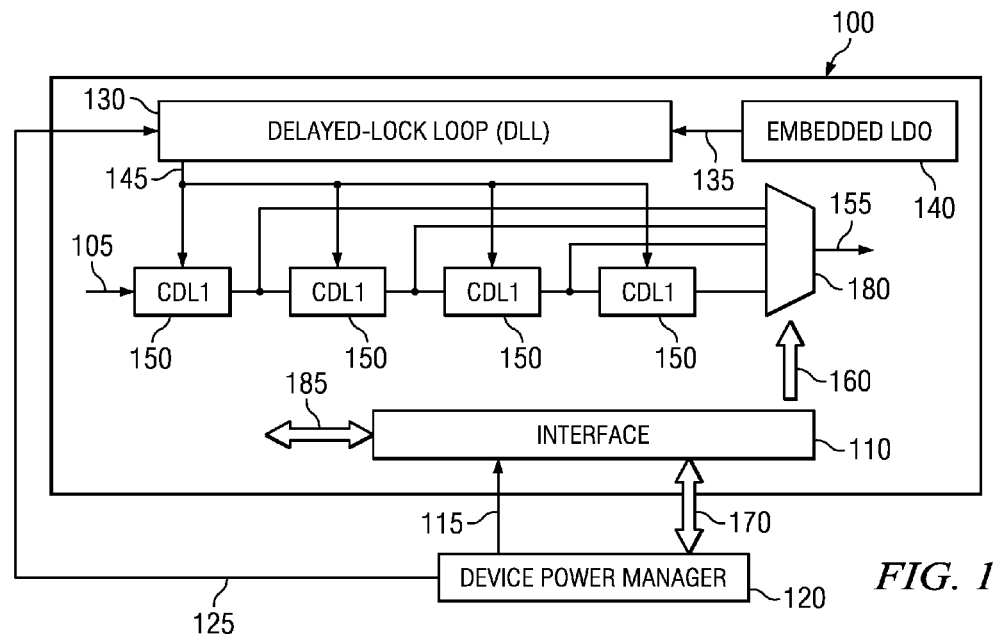
FIG. 1 schematically illustrates a particular example of various illustrative embodiments of an apparatus in accord with the present disclosure.
Figure 2:
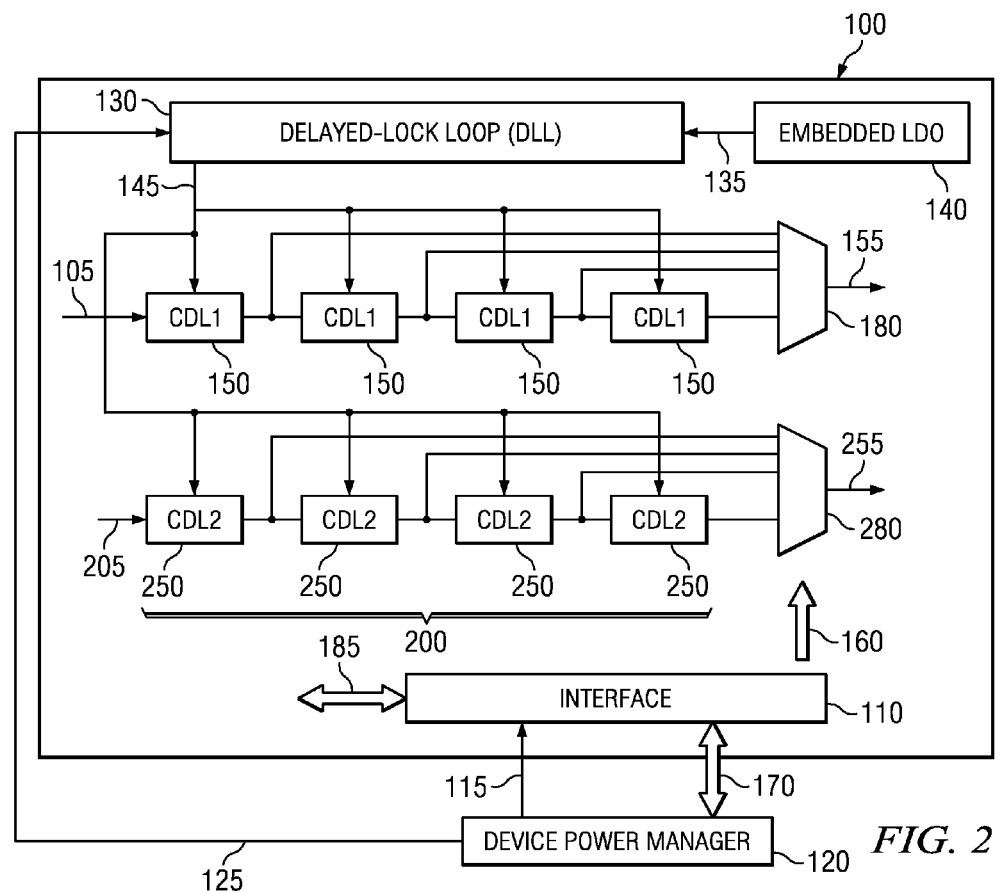
FIG. 2 schematically illustrates another particular example of various illustrative embodiments of an apparatus in accord with the present disclosure.

In various illustrative embodiments, as shown in FIG. 1 and FIG. 2, for example, an apparatus 100 for clock and voltage scaling on an interface 110 may comprise a device power manager 120 coupled to the interface 110 and arranged to supply a scalable frequency clock 115 to the interface 110. The apparatus 100 may also comprise a delay-locked loop 130 supplied by a substantially constant fixed frequency clock 125 from the device manager 120 and a substantially constant voltage 135 from an embedded low dropout regulator 140, the delay-locked loop 130 arranged to generate a unique code 145 depending on at least one of process, voltage, and temperature. The apparatus 100 may also comprise a plurality of controlled delay line elements 150 coupled to the delay-locked loop 130 and arranged to use the unique code 145 to build a delay and generate an appropriate delayed data strobe 155 from an input data strobe 105, the delay being adjusted by having up to N controlled delay line elements 150 chained together, N being a ratio between the substantially constant fixed frequency 125 and the scalable frequency 115. FIG. 1 and FIG. 2, for example, show the case where up to 4 controlled delay line elements 150 may be chained together. Those of ordinary skill in the art having the benefit of the present disclosure would recognize that the ratio N between the substantially constant fixed frequency 125 and the scalable frequency 115 may be any appropriate or suitable non-zero integer value.

In various illustrative embodiments, as shown in FIG. 2, for example, the apparatus 100 may further comprise a plurality 200 of the plurality of controlled delay line elements 150, 250 each coupled to the delay-locked loop 130 and each arranged to use the unique code 145 to build the delay and generate appropriate respective delayed data strobes 155, 255 from respective input data strobes 105, 205. FIG. 2, for example, shows the case where the plurality 200 of the plurality of controlled delay line elements 150, 250 may comprise two sets of the controlled delay line elements 150, 250 each coupled to the delay-locked loop 130 and each arranged to use the unique code 145 to build the delay and generate two appropriate respective delayed data strobes 155, 255. Those of ordinary skill in the art having the benefit of the present disclosure would recognize that the number of the sets of the controlled delay line elements 150, 250 comprising the plurality of controlled delay line elements 150, 250 may be any appropriate or suitable non-zero integer value.

In various illustrative embodiments, as shown in FIG. 1 and FIG. 2, for example, the interface 110 may be arranged to switch 160 between one of the controlled delay line elements 150 and a chain of more than one of the controlled delay line elements 150, 250 based on a handshake protocol 170 with the device power manager 120 when there is no on-going access on an interface 185. In various illustrative embodiments, the substantially constant fixed frequency clock 125 and the scalable frequency clock 115 may be derived from the same clock source. In various illustrative embodiments, the substantially constant fixed frequency clock 125 and the scalable frequency clock 115 may not be balanced. In various illustrative embodiments, at least one multiplexer 180, 280 may allow selection among the control delay line elements 150, 250, respectively.

In various illustrative embodiments, a substantially constant fixed frequency clock 125 and a substantially constant voltage 135 may be provided to the delay-locked loop (DLL) 130 while a scalable frequency clock 115 provided to the interface 110 may be changed. The clock delay, phase, and jitter may be managed so that any module in a device that comprises the apparatus 100 may access properly a device such as an external memory during a dynamic voltage and frequency scaling (DVFS) transition. In various illustrative embodiments, the apparatus 100 may manage delay elements 130, 150, 250 properly during frequency and voltage scaling.

In various illustrative embodiments, the apparatus 100 may implement the delay-locked loop (DLL) 130 and the controlled delay line elements (CDLs) 150, 250 for use with a double data rate (DDR) interface 110. The delay-locked loop (DLL) 130 may be fed by a substantially constant fixed frequency clock 125 and may generate the unique code 145 that may be used by several of the controlled delay line element (CDL) components 150, 250 that provide the respective appropriately delayed data strobe lines (DQS) 155, 255 so that the interface 110 may sample input read data properly. Similarly, the respective appropriately delayed data strobe lines (DQS) 155, 255 may be output and may be delayed so that a double data rate (DDR) device such as a DDR memory may sample write data properly.

In various illustrative embodiments, the unique code 145 may vary depending on process and/or voltage and/or temperature (PVT) variations that also impact the controlled delay line element (CDL) components 150, 250 consistently. In various illustrative embodiments, in order to avoid re-locking the delay-locked loop (DLL) 130, the delay-locked loop (DLL) 130 may be supplied with a substantially constant fixed frequency clock 125 that is separated from the scalable frequency clock 115 that may be used for the dynamic voltage and frequency scaling (DVFS) of the interface 110. The substantially constant fixed frequency clock 125 and the scalable frequency clock 115 may be derived from the same clock source, but the substantially constant fixed frequency clock 125 and the scalable frequency clock 115 do not need to be balanced. Also, substantially constant voltage for the delay-locked loop (DLL) 130 may be ensured by using the embedded low dropout regulator (LDO) 140.

In various illustrative embodiments, since the unique code 145 from the delay-locked loop (DLL) 130 may remain substantially stable for a given process and/or voltage and/or temperature (PVT) when the scalable clock 115 for the interface 110 scales, between 1 and N controlled delay line elements (CDLs) 150, 250 may be chained together in order to adapt data strobe line (DQS) delays according to the new interface 110 frequency. N corresponds to the ratio between the initial and final frequencies of the interface 110. In various illustrative embodiments, N may be a ratio between the substantially constant fixed frequency of the substantially constant fixed frequency clock 125 and the scaled frequency of the scalable frequency clock 115. The switch 160 between 1 and a chain of several controlled delay line elements (CDLs) 150, 250 may be handled by the interface 110 based on a handshake protocol 170 with the device power manager 120 so that the switch 160 may be performed when there is no on-going access on the interface 185.

In various illustrative embodiments, as shown in FIG. 1 and FIG. 2, for example, the delay-locked loop (DLL) 130 may be supplied by a substantially constant fixed frequency clock 125 from the device manager 120 and a substantially constant voltage 135 from the embedded low dropout regulator 140. For a given process, voltage, and/or temperature, the delay-locked loop 130 may generate a unique code (DCB) 145. This unique code (DCB) 145 may be used by the controlled delay line elements (CDLs) 150, 250 to build the delays and generate appropriate delayed data strobes (DSOx) 155, 255 where DSOx is generated by CDLx for any suitable non-zero integer x, each (DSOx) 155, 255 corresponding to a respective input data strobe DSIx 105, 205. Depending on the ratio N between the substantially constant fixed frequency 125 and the scalable frequency 115 of the interface 110, from 1 to N controlled delay line elements (CDLs) 150, 250 may be chained so that the delay may be properly adjusted to the new scaled scalable frequency 115 of the interface 110, where N is equal to 4 in FIG. 1 and FIG. 2, for example. Due to the handshake 170 with the device power manager 120 that initiates the frequency change, the interface 110, logic ensures that switches 160 between delay chains are properly handled when there are no on-going operations such as memory accesses. The use of delay switches 160 avoids re-locking the delay-locked loop (DLL) 130 to generate a code for the new frequency of the interface 110.

In various illustrative embodiments, the apparatus 100 may substantially ease power management software implementation by making the dynamic voltage and frequency scaling (DVFS) transition transparent. In various illustrative embodiments, the apparatus 100 may substantially optimize dynamic voltage and frequency scaling (DVFS) efficiency by removing the delay-locked loop (DLL) 130 re-lock time upon frequency scaling of the interface 110. In various illustrative embodiments, the apparatus 100 may remove substantially any architecture constraint on modules that need to access a device such as an external memory, such as first in first out (FIFO) size, and the like. In various illustrative embodiments, the apparatus 100 may substantially prevent any system access to a device such as an external memory during the frequency change. In various illustrative embodiments, the apparatus 100 may support dynamic voltage and frequency scaling (DVFS) on interconnects and other interfaces 110, whereas, conventionally, dynamic voltage and frequency scaling (DVFS) is only applied on processors.

Figure 3:
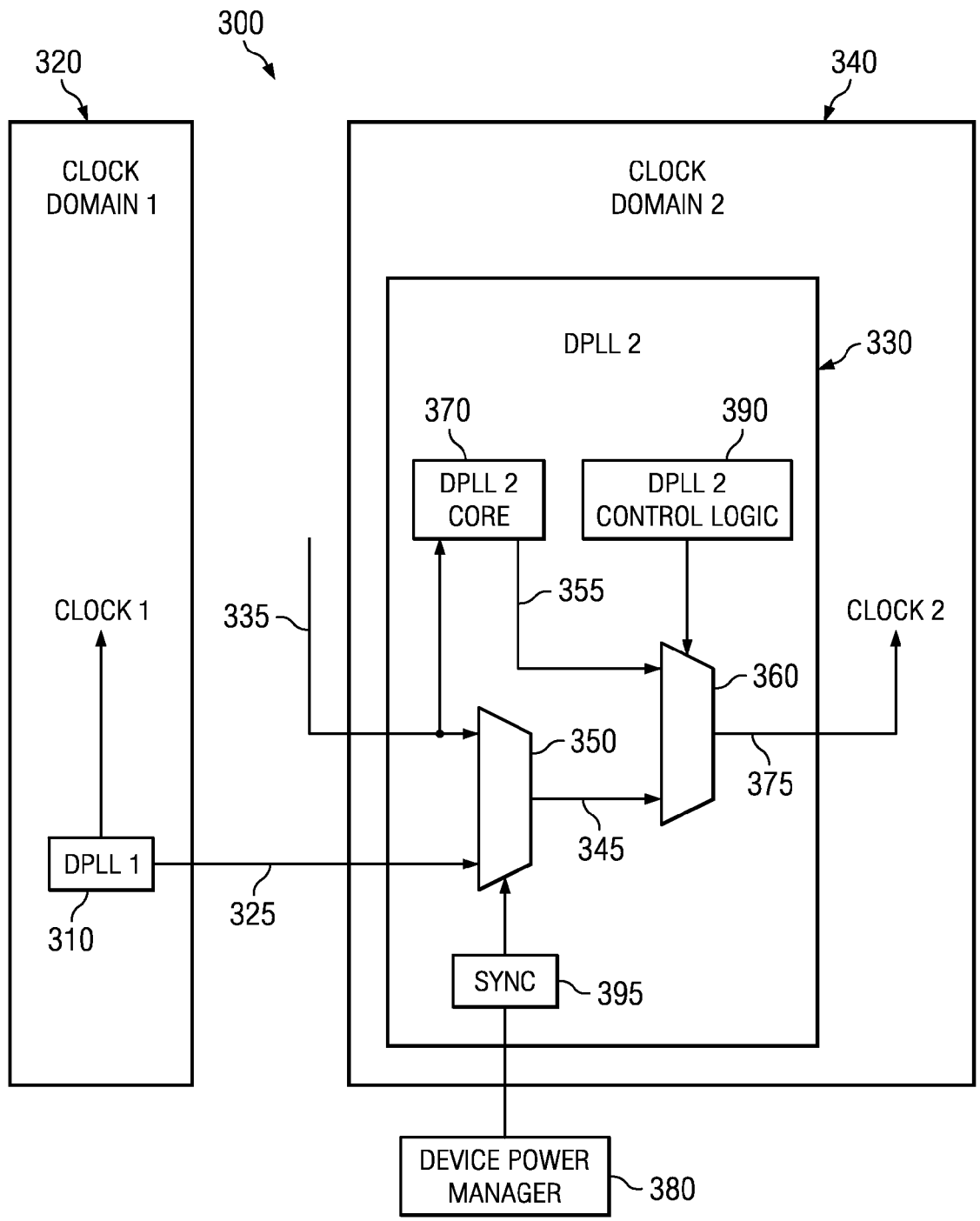
FIG. 3 schematically illustrates yet another particular example of various illustrative embodiments of an apparatus in accord with the present disclosure.
Figure 4:
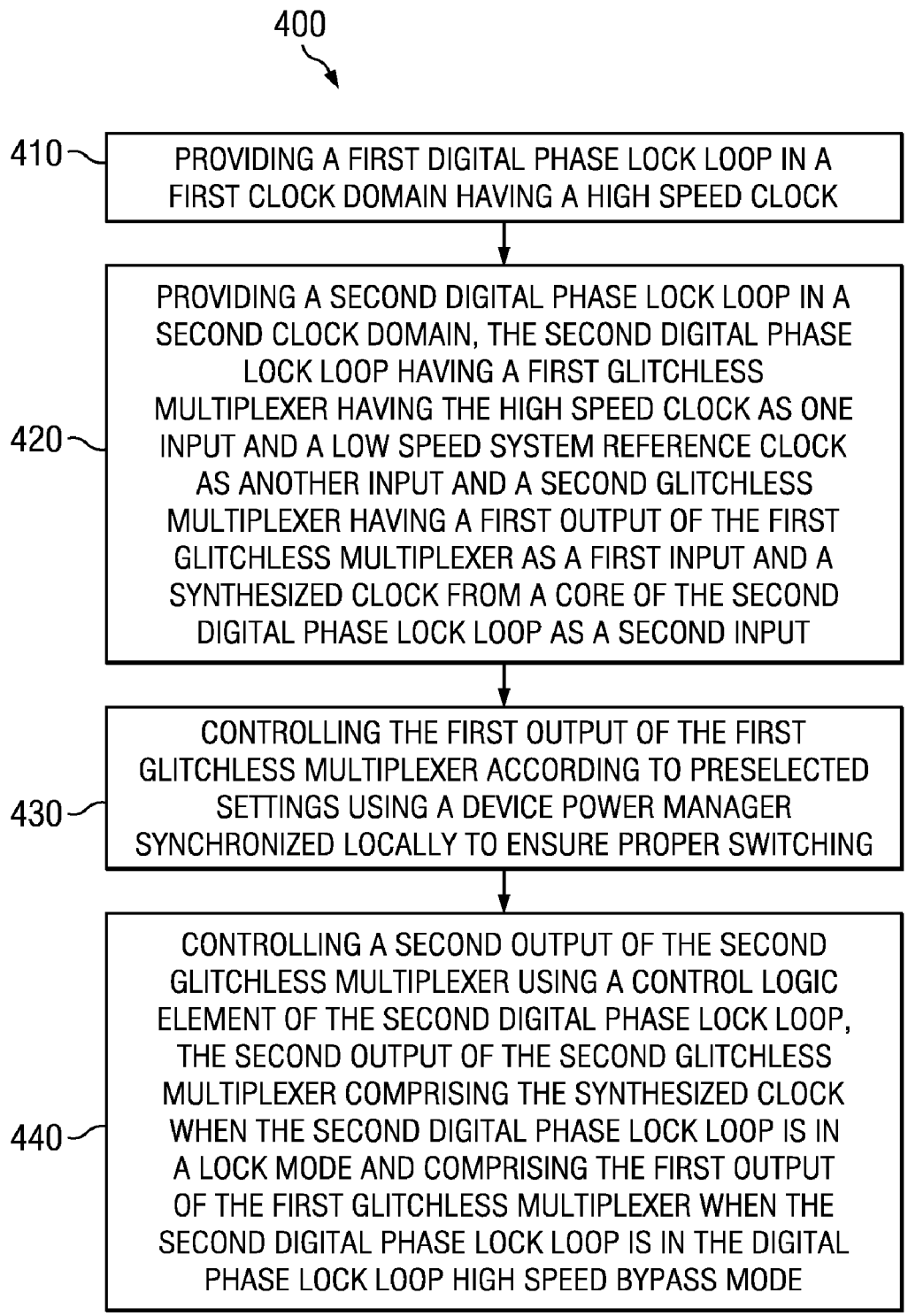
FIG. 4 schematically illustrates a particular example of various illustrative embodiments of a method in accord with the present disclosure.

In various illustrative embodiments, as shown in FIG. 3 and FIG. 4, for example, a method 400 for a digital phase lock loop high speed bypass mode may comprise providing a first digital phase lock loop 310 of an apparatus 300 in a first clock domain 320 having a high speed clock 325, as indicated at 410. The method 400 may also comprise providing at least one second digital phase lock loop 330 in a second clock domain 340, the at least one second digital phase lock loop 330 having a first glitchless multiplexer 350 having the high speed clock 325 as one input and a low speed system reference clock 335 as another input and a second glitchless multiplexer 360 having a first output 345 of the first glitchless multiplexer 350 as a first input 345 and a synthesized clock 355 from a core 370 of the at least one second digital phase lock loop 330 as a second input 355, as indicated at 420. The method 400 may also comprise controlling the first output 345 of the first glitchless multiplexer 350 according to preselected settings using a device power manager 380 synchronized locally to ensure proper switching, as indicated at 430. The method 400 may also comprise controlling a second output 375 of the second glitchless multiplexer 360 using a control logic element 390 of the at least one second digital phase lock loop 330, the second output 375 of the second glitchless multiplexer 360 comprising the synthesized clock 355 when the at least one second digital phase lock loop 330 is in a lock mode and comprising the first output 345 of the first glitchless multiplexer 350 when the at least one second digital phase lock loop 330 is in the digital phase lock loop high speed bypass mode, as indicated at 440.

In various illustrative embodiments, the first digital phase lock loop 310 supplies the high speed clock 325 to the at least one second digital phase lock loop 330. In various illustrative embodiments, controlling the first output 345 of the first glitchless multiplexer 350 according to preselected settings using the device power manager 380 synchronized locally further comprises using a synchronization element 395 disposed in the at least one second digital phase lock loop 330.

In various illustrative embodiments, the first output 345 of the first glitchless multiplexer 350 when the at least one second digital phase lock loop 330 is in the digital phase lock loop high speed bypass mode comprises the high speed clock 325. In various illustrative embodiments, the first output 345 of the first glitchless multiplexer 350 when the at least one second digital phase lock loop 330 is in the digital phase lock loop high speed bypass mode comprises the low speed system reference clock 335. In various illustrative embodiments, the low speed system reference clock 335 is input to the core 370 of the at least one second digital phase lock loop 330. In various illustrative embodiments, the control logic element 390 of the at least one second digital phase lock loop 330 is coupled to the core 370 of the at least one second digital phase lock loop 330.

In various illustrative embodiments, the method 400 may provide a savings in the power consumption of the digital phase lock loops (DPLLs) 310, 330. For a given clock domain, such as the second clock domain 340, when the required frequency does not exceed a frequency used by another clock domain, such as the first clock domain 320, the at least one second digital phase lock loop (DPLL) 330 may be set in bypass mode and use the high speed clock output 325 of the first digital phase lock loop (DPLL) 310 in the first clock domain 320 as an alternative high speed clock source, saving overall power consumption.

In various illustrative embodiments, the method 400 may maintain higher processing performance during the time required for a digital phase lock loop (DPLL) re-lock operation. For a given clock domain, such as the second clock domain 340, when a re-lock is programmed on the at least one second digital phase lock loop (DPLL) 330 of the second clock domain 340, or when the at least one second digital phase lock loop (DPLL) 330 loses its lock under hardware conditions, the at least one second digital phase lock loop (DPLL) 330 automatically switches to the bypass mode. In the bypass mode, the output of the at least one second digital phase lock loop (DPLL) 330 switches from the high speed synthesized clock 355 to either the low speed system reference clock 335 or the high speed clock 325 of the first digital phase lock loop (DPLL) 310 in the first clock domain 320. By using an additional high speed bypass clock input, generated from another clock domain, such as the high speed clock 325 of the first digital phase lock loop (DPLL) 310 in the first clock domain 320, the at least one second digital phase lock loop (DPLL) 330 may output a high speed clock even during re-lock and allows processing maintaining higher performance during the re-lock operation.

In various illustrative embodiments, the method 400 may involve an implementation with an additional high speed clock input, such as the high speed clock 325, and specific bypass multiplexers (muxes) with appropriate controls, such as the first glitchless multiplexer 350 and the second glitchless multiplexer 360. A user may define whether the at least one second digital phase lock loop (DPLL) 330 outputs the low speed (low frequency) system reference clock 335 or the high speed (high frequency) clock 325 when the at least one second digital phase lock loop (DPLL) 330 switches to the bypass mode, in the at least one second digital phase lock loop (DPLL) 330 low power mode or during re-lock.

In various illustrative embodiments, a digital phase lock loop (DPLL), such as the at least one second digital phase lock loop (DPLL) 330, may implement a scheme, such as method 400, where any clock domain, such as the second clock domain 340, may use a clock issued from another clock domain, such as the high speed clock 325 issued from the first clock domain 320, as a domain clock source when the digital phase lock loop (DPLL), such as the at least one second digital phase lock loop (DPLL) 330, enters in a bypass mode. The scheme, such as method 400, may comprise adding an additional high speed clock input, such as the high speed clock 325, and a glitchless multiplexer (mux), such as the first glitchless multiplexer 350.

This glitchless multiplexer (mux), such as the first glitchless multiplexer 350, may be controlled by a device power manager (DPM), such as the device power manager 380, according to the user settings. This glitchless multiplexer (mux), such as the first glitchless multiplexer 350, may allow selecting the bypass clock source to be either the digital phase lock loop (DPLL) reference clock input, such as the low speed (low frequency) system reference clock 335, or the high speed clock input, such as the high speed (high frequency) clock 325. Control of this glitchless multiplexer (mux), such as the first glitchless multiplexer 350, may be synchronized locally to ensure proper switching.

In a lock mode, the digital phase lock loop (DPLL), such as the at least one second digital phase lock loop (DPLL) 330, may output a synthesized clock, such as the synthesized clock 355. A bypass clock source may be automatically output from the digital phase lock loop (DPLL), such as the at least one second digital phase lock loop (DPLL) 330, when the digital phase lock loop (DPLL), such as the at least one second digital phase lock loop (DPLL) 330, enters into the bypass mode, during re-lock or upon user request, for example, due to another glitchless multiplexer (mux), such as the second glitchless multiplexer 360, as described above.

In various illustrative embodiments, the method 400 may save overall power consumption and/or may substantially optimize dynamic voltage and frequency scaling (DVFS) performance. In various illustrative embodiments, the method 400 may be substantially generic for substantially any multiple clock domain platform. In various illustrative embodiments, the method 400 may be simple to implement. In various illustrative embodiments, the method 400 may be easy to validate. In various illustrative embodiments, the method 400 may be low cost.

Figure 5:
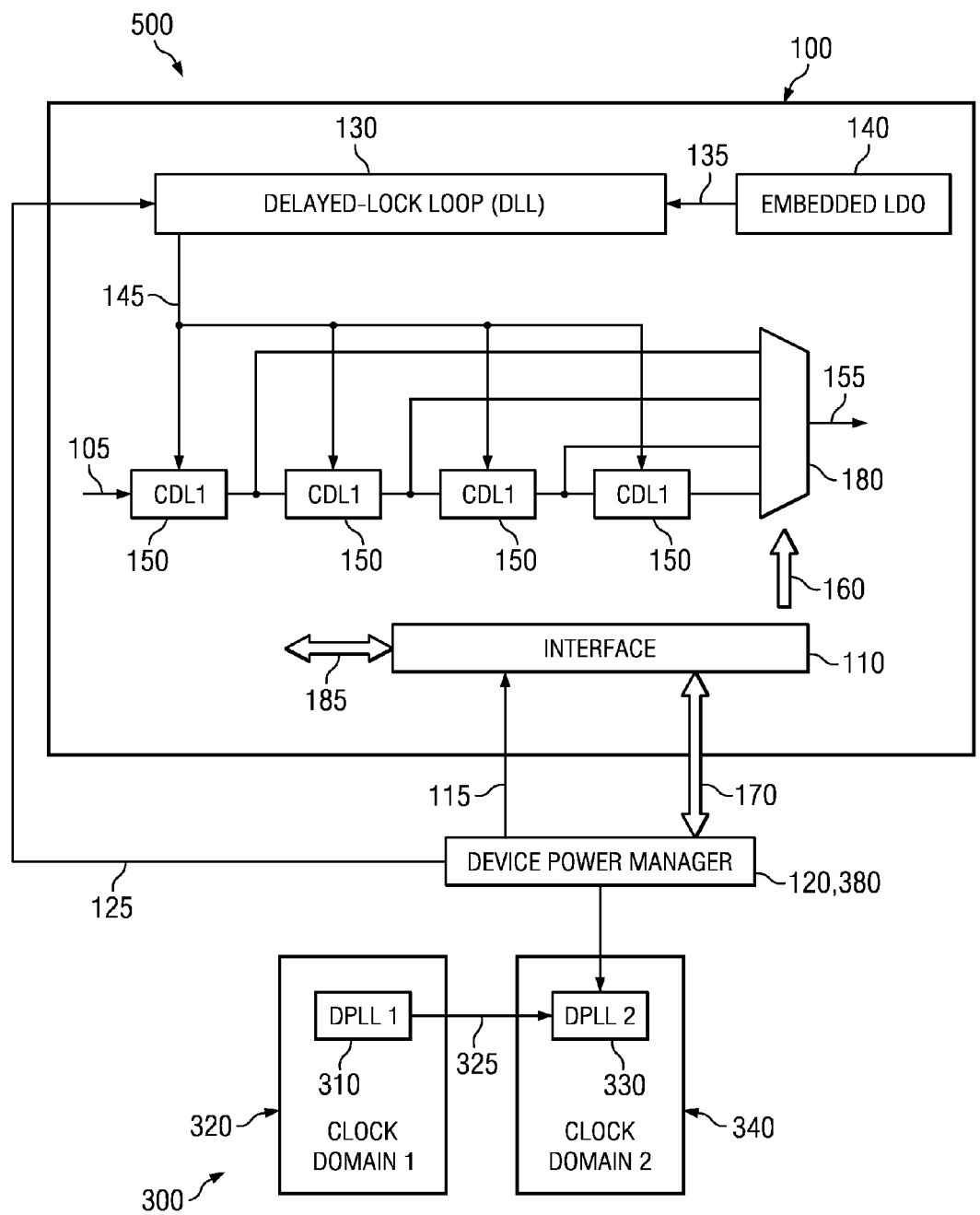
FIG. 5 schematically illustrates a particular example of various illustrative embodiments of a system in accord with the present disclosure.

In various illustrative embodiments, as shown in FIG. 1, FIG. 3, and FIG. 5, for example, a system 500 for clock and voltage scaling on a interface 110 and for providing a digital phase lock loop high speed bypass mode may comprise a device power manager 120, 380 coupled to the interface 110 and arranged to supply a scalable frequency clock 115 to the interface 110. The system 500 may also comprise a delay-locked loop 130 supplied by a substantially constant fixed frequency clock 125 from the device manager 120, 380 and a substantially constant voltage 135 from an embedded low dropout regulator 140, the delay-locked loop 130 arranged to generate a unique code 145 depending on at least one of process, voltage, and temperature. The system 500 may also comprise a plurality of controlled delay line elements 150 coupled to the delay-locked loop 130 and arranged to use the unique code 145 to build a delay and generate an appropriate delayed data strobe 155 from an input data strobe 105, the delay being adjusted by having up to N controlled delay line elements 150 chained together, N being a ratio between the substantially constant fixed frequency 125 and the scalable frequency 115.

The system 500 may also comprise a first digital phase lock loop 310 in a first clock domain 320 having a high speed clock 325. The system 500 may also comprise at least one second digital phase lock loop 330 in a second clock domain 340, the at least one second digital phase lock loop 330 having a first glitchless multiplexer 350 having the high speed clock 325 as one input and a low speed system reference clock 335 as another input and a second glitchless multiplexer 360 having a first output 345 of the first glitchless multiplexer 350 as a first input 345 and a synthesized clock 355 from a core 370 of the at least one second digital phase lock loop 330 as a second input 355, wherein the device power manager 120, 380 is arranged to control the first output 345 of the first glitchless multiplexer 350 according to preselected settings and is synchronized locally to ensure proper switching. The system 500 may also comprise a control logic element 390 of the at least one second digital phase lock loop 330 arranged to control a second output 375 of the second glitchless multiplexer 360, the second output 375 of the second glitchless multiplexer 360 comprising the synthesized clock 355 when the at least one second digital phase lock loop 330 is in a lock mode and comprising the first output 345 of the first glitchless multiplexer 350 when the at least one second digital phase lock loop 330 is in the digital phase lock loop high speed bypass mode.

According to various illustrative embodiments, an apparatus, method, and system for enhancement of locked loop operations including clock and voltage scaling on an interface and/or for providing a digital phase lock loop high speed bypass mode are described. In one aspect, the apparatus comprises a device power manager coupled to the interface and arranged to supply a scalable frequency clock to the interface. The apparatus also comprises a delay-locked loop supplied by a substantially constant fixed frequency clock from the device manager and a substantially constant voltage from an embedded low dropout regulator, the delay-locked loop arranged to generate a unique code depending on at least one of process, voltage, and temperature. The apparatus also comprises a plurality of controlled delay line elements coupled to the delay-locked loop and arranged to use the unique code to build a delay and generate an appropriate delayed data strobe, the delay being adjusted by having up to N controlled delay line elements chained together, N being a ratio between the substantially constant fixed frequency and the scalable frequency.

In various aspects, the apparatus further comprises a plurality of the plurality of controlled delay line elements each coupled to the delay-locked loop and each arranged to use the unique code to build the delay and generate an appropriate respective delayed data strobe. In various aspects, the apparatus further comprises the interface being arranged to switch between one of the controlled delay line elements and a chain of more than one of the controlled delay line elements based on a handshake protocol with the device power manager when there is no on-going access on a second interface.

In various aspects, the apparatus further comprises the substantially constant fixed frequency clock and the scalable frequency clock being derived from the same clock source. In various aspects, the apparatus further comprises the substantially constant fixed frequency clock and the scalable frequency clock being not balanced. In various aspects, the apparatus further comprises the up to N controlled delay line elements being chained together by at least one multiplexer.

In another aspect, a method for a digital phase lock loop high speed bypass mode comprises providing a first digital phase lock loop in a first clock domain having a high speed clock. The method also comprises providing at least one second digital phase lock loop in a second clock domain, the at least one second digital phase lock loop having a first glitchless multiplexer having the high speed clock as one input and a low speed system reference clock as another input and a second glitchless multiplexer having a first output of the first glitchless multiplexer as a first input and a synthesized clock from a core of the at least one second digital phase lock loop as a second input. The method also comprises controlling the first output of the first glitchless multiplexer according to preselected settings using a device power manager synchronized locally to ensure proper switching. The method also comprises controlling a second output of the second glitchless multiplexer using a control logic element of the at least one second digital phase lock loop, the second output of the second glitchless multiplexer comprising the synthesized clock when the at least one second digital phase lock loop is in a lock mode and comprising the first output of the first glitchless multiplexer when the at least one second digital phase lock loop is in the digital phase lock loop high speed bypass mode.

In various aspects, the method further comprises the first digital phase lock loop supplying the high speed clock to the at least one second digital phase lock loop. In various aspects, the method further comprises controlling the first output of the first glitchless multiplexer according to preselected settings using the device power manager synchronized locally further comprising using a synchronization element disposed in the at least one second digital phase lock loop.

In various aspects, the method further comprises the first output of the first glitchless multiplexer when the at least one second digital phase lock loop is in the digital phase lock loop high speed bypass mode comprising the high speed clock. In various aspects, the method further comprises the first output of the first glitchless multiplexer when the at least one second digital phase lock loop is in the digital phase lock loop high speed bypass mode comprising the low speed system reference clock. In various aspects, the method further comprises the low speed system reference clock being input to the core of the at least one second digital phase lock loop. In various aspects, the method further comprises the control logic element of the at least one second digital phase lock loop being coupled to the core of the at least one second digital phase lock loop.

In yet another aspect, a system for clock and voltage scaling on an interface and for providing a digital phase lock loop high speed bypass mode is provided, the system comprising comprises a device power manager coupled to the interface and arranged to supply a scalable frequency clock to the interface. The system also comprises a delay-locked loop supplied by a substantially constant fixed frequency clock from the device manager and a substantially constant voltage from an embedded low dropout regulator, the delay-locked loop arranged to generate a unique code depending on at least one of process, voltage, and temperature. The system also comprises a plurality of controlled delay line elements coupled to the delay-locked loop and arranged to use the unique code to build a delay and generate an appropriate delayed data strobe, the delay being adjusted by having up to N controlled delay line elements chained together, N being a ratio between the substantially constant fixed frequency and the scalable frequency. The system also comprises a first digital phase lock loop in a first clock domain having a high speed clock. The system also comprises at least one second digital phase lock loop in a second clock domain, the at least one second digital phase lock loop having a first glitchless multiplexer having the high speed clock as one input and a low speed system reference clock as another input and a second glitchless multiplexer having a first output of the first glitchless multiplexer as a first input and a synthesized clock from a core of the at least one second digital phase lock loop as a second input, wherein the device power manager is arranged to control the first output of the first glitchless multiplexer according to preselected settings and synchronized locally to ensure proper switching. The system also comprises a control logic element of the at least one second digital phase lock loop arranged to control a second output of the second glitchless multiplexer, the second output of the second glitchless multiplexer comprising the synthesized clock when the at least one second digital phase lock loop is in a lock mode and comprising the first output of the first glitchless multiplexer when the at least one second digital phase lock loop is in the digital phase lock loop high speed bypass mode.

In accordance with the present disclosure, an apparatus, system, and method useful for clock and voltage scaling on an interface are disclosed. In various aspects, an apparatus in accordance with the present disclosure may comprise means for clock and voltage scaling on an interface and means for enabling the means for clock and voltage scaling on the interface, both the means for clock and voltage scaling on the interface and the means for enabling the means for clock and voltage scaling on the interface covering corresponding structures and/or materials described herein and equivalents thereof.

In various other aspects, a system in accordance with the present disclosure may comprise means for clock and voltage scaling on an interface, means for enabling the means for clock and voltage scaling on the interface, and means for using the means for clock and voltage scaling on the interface, all of the means for clock and voltage scaling on the interface, the means for enabling the means for clock and voltage scaling on the interface, and the means for using the means for clock and voltage scaling on the interface covering corresponding structures and/or materials described herein and equivalents thereof. In yet various other aspects, a method in accordance with the present disclosure may comprise steps for clock and voltage scaling on an interface and steps for enabling the steps for clock and voltage scaling on the interface, both the steps for clock and voltage scaling on the interface and the steps for enabling the steps for clock and voltage scaling on the interface covering corresponding acts described herein and equivalents thereof.

In accordance with the present disclosure, an apparatus, system, and method useful for providing a digital phase lock loop high speed bypass mode are disclosed. In various aspects, an apparatus in accordance with the present disclosure may comprise means for providing a digital phase lock loop high speed bypass mode and means for enabling the means for providing the digital phase lock loop high speed bypass mode, both the means for providing the digital phase lock loop high speed bypass mode and the means for enabling the means for providing the digital phase lock loop high speed bypass mode covering corresponding structures and/or materials described herein and equivalents thereof.

In various other aspects, a system in accordance with the present disclosure may comprise means for providing a digital phase lock loop high speed bypass mode, means for enabling the means for providing the digital phase lock loop high speed bypass mode, and means for using the means for providing the digital phase lock loop high speed bypass mode, all of the means for providing the digital phase lock loop high speed bypass mode, the means for enabling the means for providing the digital phase lock loop high speed bypass mode, and the means for using the means for providing the digital phase lock loop high speed bypass mode covering corresponding structures and/or materials described herein and equivalents thereof. In yet various other aspects, a method in accordance with the present disclosure may comprise steps for providing a digital phase lock loop high speed bypass mode and steps for enabling the steps for providing the digital phase lock loop high speed bypass mode, both the steps for providing the digital phase lock loop high speed bypass mode and the steps for enabling the steps for providing the digital phase lock loop high speed bypass mode covering corresponding acts described herein and equivalents thereof.

The particular embodiments disclosed above are illustrative only, as the present claimed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present claimed subject matter. In particular, every range of values (of the form, "from about a to about b," or, equivalently, "from approximately a to b," or, equivalently, "from approximately a-b") disclosed herein is to be understood as referring to the power set (the set of all subsets) of the respective range of values, in the sense of Georg Cantor. Accordingly, the protection sought herein is as set forth in the claims below.

What is claimed is:

1. An apparatus for clock and voltage scaling on an interface, the apparatus comprising:
   a device power manager coupled to the interface and arranged to supply a scalable frequency clock to the interface;
   a delay-locked loop supplied by a substantially constant fixed frequency clock from the device manager and a substantially constant voltage from an embedded low dropout regulator, the delay-locked loop arranged to generate a unique code depending on at least one of process, voltage, and temperature; and
   a plurality of controlled delay line elements coupled to the delay-locked loop and arranged to use the unique code to build a delay and generate an appropriate delayed data strobe, the delay being adjusted by having up to N controlled delay line elements chained together, N being a ratio between the substantially constant fixed frequency and the scalable frequency.

2. The apparatus of claim 1, wherein the interface includes a memory controller.

3. The apparatus of claim 1 further comprising:
   a plurality of the plurality of controlled delay line elements each coupled to the delay-locked loop and each arranged to use the unique code to build the delay and generate an appropriate respective delayed data strobe.

4. The apparatus of claim 1, wherein the interface is arranged to switch between one of the controlled delay line elements and a chain of more than one of the controlled delay line elements based on a handshake protocol with the device power manager when there is no on-going access on a second interface.

5. The apparatus of claim 1, wherein the substantially constant fixed frequency clock and the scalable frequency clock are derived from the same clock source.

6. The apparatus of claim 1, wherein the substantially constant fixed frequency clock and the scalable frequency clock are not balanced.

7. The apparatus of claim 1, wherein the up to N controlled delay line elements are chained together by at least one multiplexer.

8. The apparatus of claim 1, wherein the scalable frequency clock that scales the frequency supplied to the interface may be changed.

9. The apparatus of claim 1, wherein the interface is a double data rate interface.

10. The apparatus of claim 1, wherein the substantially constant fixed frequency clock and the scalable frequency clock are separate.

11. The apparatus of claim 1, wherein the unique code remains substantially stable for at least one of the process, the voltage, and the temperature when the scalable frequency clock scales the frequency.

12. A system for clock and voltage scaling on an interface and for providing a digital phase lock loop high speed bypass mode, the system comprising:
   a device power manager coupled to the interface and arranged to supply a scalable frequency clock to the interface; and
   a delay-locked loop supplied by a substantially constant fixed frequency clock from the device manager and a substantially constant voltage from an embedded low dropout regulator, the delay-locked loop arranged to generate a unique code depending on at least one of process, voltage, and temperature.

13. The system of claim 12, further comprising:
a plurality of controlled delay line elements coupled to the delay-locked loop and arranged to use the unique code to build a delay and generate an appropriate delayed data strobe, the delay being adjusted by having up to N controlled delay line elements chained together, N being a ratio between the substantially constant fixed frequency and the scalable frequency.

14. The system of claim 13, further comprising:
a first digital phase lock loop in a first clock domain having a high speed clock; and
at least one second digital phase lock loop in a second clock domain, the at least one second digital phase lock loop having a first glitchless multiplexer having the high speed clock as one input and a low speed system reference clock as another input and a second glitchless multiplexer having a first output of the first glitchless multiplexer as a first input and a synthesized clock from a core of the at least one second digital phase lock loop as a second input, wherein the device power manager is arranged to control the first output of the first glitchless multiplexer according to preselected settings and is synchronized locally to ensure proper switching.

15. The system of claim 14, further comprising:
a control logic element of the at least one second digital phase lock loop arranged to control a second output of the second glitchless multiplexer, the second output of the second glitchless multiplexer comprising the synthesized clock when the at least one second digital phase lock loop is in a lock mode and comprising the first output of the first glitchless multiplexer when the at least one second digital phase lock loop is in the digital phase lock loop high speed bypass mode.

* * * * *